(12) United States Patent
Hartmaier et al.

(10) Patent No.: US 6,667,839 B2
(45) Date of Patent: Dec. 23, 2003

(54) HOLDING DEVICE FOR AN OPTICAL ELEMENT MADE OF A CRYSTALLINE MATERIAL

(75) Inventors: Jürgen Hartmaier, Aalen (DE); Dietrich Klaassen, Oberkochen (DE); Thure Boehm, Aalen (DE); Bernhard Wergl, Steinheim (DE); Michael Gerhard, Aalen-Ebnat (DE); Jens Spanuth, Aalen (DE); Ralf Kuschnereit, Oberkochen (DE); Peter Vogt, Heidenheim (DE); Harry Bauer, Aalen (DE)

(73) Assignee: Carl Zeiss SMT AG (DE)

( * ) Notice: Subject to any disclaimer, the term of this patent is extended or adjusted under 35 U.S.C. 154(b) by 11 days.

(21) Appl. No.: 10/033,670

(22) Filed: Dec. 27, 2001

(65) Prior Publication Data
US 2002/0108928 A1 Aug. 15, 2002

(30) Foreign Application Priority Data
Jan. 5, 2001 (DE) .......................................... 101 00 328

(51) Int. Cl.⁷ .......................... G02B 7/02; G03B 17/26; G03B 21/14; F21V 17/00
(52) U.S. Cl. ...................... 359/820; 359/819; 359/811; 396/526; 362/455; 353/100
(58) Field of Search ............................. 359/819, 811, 359/820; 396/526; 362/455; 353/100

(56) References Cited

U.S. PATENT DOCUMENTS

| 5,106,196 A | * | 4/1992 | Brierley | 356/445 |
| 5,527,393 A | | 6/1996 | Sato et al. | 118/725 |
| 5,626,678 A | * | 5/1997 | Sahin et al. | 118/723 E |

FOREIGN PATENT DOCUMENTS

| CH | 679 838 A5 | 11/1990 |
| DE | 44 46 179 A1 | 12/1994 |
| DE | 199 32 338 C1 | 7/1999 |
| EP | 0 215 261 A2 | 8/1986 |
| EP | 0 743 377 A1 | 11/1996 |
| JP | 08136862 | 5/1996 |
| JP | 08194755 | 2/1998 |

* cited by examiner

Primary Examiner—Hung Xuan Dang
Assistant Examiner—Joseph Martinez
(74) Attorney, Agent, or Firm—Wells St. John P.S.

(57) ABSTRACT

A device is used to hold an optical element, in particular one made of a crystalline material, in particular of $CaF_2$, while the optical element is being coated, in particular by the vapor-deposition of at least one functional layer in a vacuum coating plant. The latter has a device for mounting the optical element, it being possible for the optical element to be heated in the vacuum coating plant via suitable radiation, in particular infrared radiation. An intermediate element which has a lower thermal absorption than the device for mounting the optical element is arranged between the device for mounting the optical element and the optical element.

19 Claims, 1 Drawing Sheet

HOLDING DEVICE FOR AN OPTICAL
ELEMENT MADE OF A CRYSTALLINE
MATERIAL

RELATED APPLICATIONS

This application relates to and claims priority to corresponding German Patent Application No. 101 00 328.5 filed on Jan. 5, 2001.

BACKGROUND OF THE INVENTION

The invention relates to a holding device for an optical element, while the optical element is being coated in a vacuum coating plant having a mounting-device for the optical element, it being possible for the optical element to be heated in the vacuum coating plant via suitable radiation.

In general, optical elements are very frequently coated with functional layers to improve the optical quality, for example antireflection coatings or the like. This coating is normally carried out in a vacuum coating plant, into which the optical elements are introduced and in which they are heated while, at the same time, the substances for the corresponding functional layer are fed in. The substances for the corresponding functional layer are then deposited on the surfaces of the optical elements. In order to achieve the most uniform deposition possible on the surfaces of the optical elements, the latter are inserted into corresponding mountings for holding the optical elements and are generally moved in the vacuum coating plant.

Since, then, lenses of this type or other optical elements made of crystalline materials, which are used for example in the semiconductor lithography technique, have relatively large diameters and are comparatively heavy, these devices for mounting the optical elements in the vacuum coating plant, with the corresponding driven axes, are designed from high-strength materials, in order for example to be able to coat four or more lenses simultaneously in the vacuum coating plant, without the mountings failing as a result of the weight loading together with the thermal loading which occurs. For this purpose, the holding elements are generally designed from a high-strength metal, for example steel.

Then, because of the vacuum or at least approximately complete vacuum, appropriate radiators must be used in order to ensure that the optical elements are heated up, since the transfer of heat as a result of convection or the like cannot be utilized in a vacuum. In the case of these radiators, these are conventionally infrared radiators, but there is the problem that these also heat the components which surround the optical elements and which, as already mentioned at the beginning, are usually designed from steel to a very great extent. In this way, a very large temperature difference arises between the devices for mounting the optical element and the optical element itself, which leads to a temperature gradient within the optical element.

Therefore, in the area in which the optical element rests on the mountings, a very large point input of heat occurs, since here the mountings, which generally absorb the heat better than the optical element, introduce a very large amount of thermal energy into the optical element, said energy being transported away only inadequately by the latter, since crystalline materials of the type mentioned at the beginning are generally poorer heat conductors than steel, and it being possible for said energy to be distributed in the element. A very high temperature gradient is therefore established in the optical element itself as well, which leads to high thermal stresses in the optical element. This increase in the thermal stress normally takes place in an area in which, as a result of the fact that the optical element is supported on the devices in order to mount it, very high inputs of stress in any case act on the optical element, because of the forces of gravity. It is therefore very easy for a critical shear stress to be exceeded in these areas of the optical element, as a result of the addition of gravitational stress and thermally induced stress. In the case of crystalline materials, this can lead to an offset in the lattice planes or the like, which makes the optical elements unusable for further applications in the area of high-power optics, since plastic deformation occurs.

SUMMARY OF THE INVENTION

It is therefore the object of the invention to provide a device which is used to hold an optical element, in particular one made of a crystalline material, during coating of the optical element, in particular by means of vapor deposition of at least one functional layer in a vacuum coating plant, and which avoids the input of thermal loadings into the optical element.

According to the invention, this object is achieved by the features recited in claim 1.

The fact that an intermediate element is used, which has a lower heat absorption than the device for mounting the optical element, means that the thermal energy present in the mountings does not reach the optical element to the full extent. The input of thermal energy into these areas, which are in any case very critical, of the optical element in the area in which it is supported is avoided, and the addition of thermally induced stresses and stresses in the crystal of the optical element, introduced by gravitation, therefore generally remains under a critical shear stress which could effect plastic deformation of the optical element.

In a particularly beneficial refinement of the invention, the intermediate element is additionally connected to the device for mounting the optical element via supporting elements made of a poorly heat-conducting material.

This provides a further advantage. Here, the input of thermal energy from the mountings to the intermediate element, and therefore also to the optical element, can be virtually completely prevented, since the corresponding supporting elements, which can, for example, be designed as small spheres made of ceramic or the like, virtually do not pass on the heat into the intermediate element and therefore into the optical element, in particular also because of their small contact area.

In a further, very beneficial embodiment of the invention, the intermediate element additionally has a coating that reflects the radiation used to heat the optical element.

This coating, which may be composed of gold or the like, virtually completely reflects the radiation used to heat the optical element, so that the intermediate element which, in a particularly beneficial combination of the two embodiments described, is additionally thermally decoupled from the mountings via the supporting elements, is virtually not heated or, in any case, no more than the optical element itself. The input of thermally induced stresses into the optical element, which are caused by local heating and associated high temperature differences between the individual points of the optical element, can therefore be eliminated virtually completely. Coating the optical element with one or more appropriate functional layers is then possible without difficulty, without any impairment of the optical quality of the optical element on account of mutually offset lattice planes or the like, that is to say plastic deformation, having to be feared.

A further advantage is that the intermediate element can be designed in such a way that it has a very good thermal conductivity and, at the same time, a very low heat capacity. It is then possible for the intermediate element virtually always to be at the same temperature as the optical element, since thermal differences are balanced out very quickly as a result of its good thermal conductivity. As a result of the simultaneously very small heat capacity, which can be achieved for example by means of a relatively thin design of the intermediate element, with a very low mass, barely any storage effects, which delay the temperature differences over time, occur in the area of the intermediate element.

In principle, intermediate elements made of corresponding, temperature-resistant plastics would of course also be conceivable here, since these would combine very advantageous properties with regard to heat capacity and heat conduction with very beneficial mechanical properties. However, it should then be ensured that, in the vacuum coating plant, no organic substances can evaporate off from the plastics, which might be deposited on the optical element and could cause impairment of the quality to be achieved of a functional coating on the optical element.

BRIEF DESCRIPTION OF THE DRAWINGS

Further advantageous refinements emerge from the remaining subclaims and from the following exemplary embodiment, using the drawings.

In the drawings.

DETAILED DESCRIPTION OF THE PREFERRED EMBODIMENTS

Figure 1:
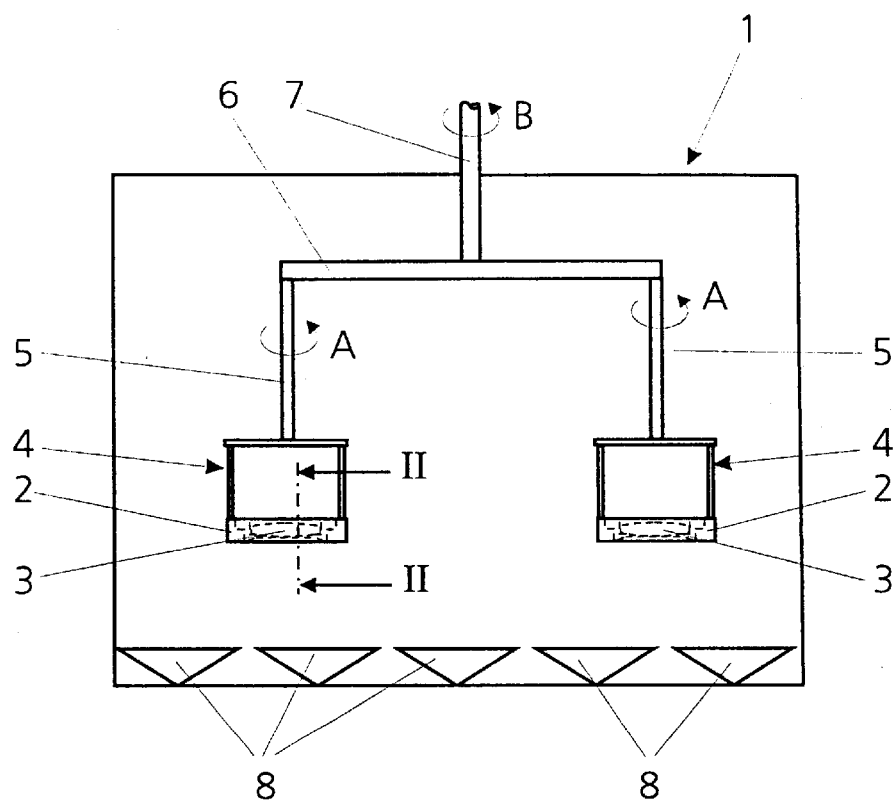
FIG. 1 shows a highly schematic vacuum coating plant in a basic cross section.

FIG. 1 indicates a vacuum coating plant 1 in a very highly schematic representation. In the interior of the vacuum coating plant 1, two devices 2 for mounting one optical element 3 each are represented in basic form. The devices 2 for mounting the optical element 3 are in this case each connected via a holding mechanism 4 to a shaft 5, each of which rotates in accordance with the arrows A. This unit comprising the holding mechanism 4, shaft 5 and device 2 for mounting the optical element 3 is then fixed to a crossbeam 6, which in turn rotates about an axle 7 in accordance with the arrow B. The individual optical elements 3 therefore execute cycloidal movements by which means uniform coating of the surface of the optical elements can be achieved. It is usual for more than two of the optical elements to be fixed to the crossbeam 6 via the corresponding components 5, 4, 2, so that four or more optical elements 3 can be provided simultaneously in the vacuum coating plant 1 with a surface layer, for example an antireflection coating.

In order to be able to heat up the optical elements 3 for the evaporation with the corresponding functional layer, in spite of the vacuum in the vacuum coating plant 1, the vacuum coating plant 1 has a plurality of radiators 8, which are indicated here in principle. By means of the radiation emerging from the radiators 8, the optical elements 3 are heated up to the temperature required for the evaporation. The radiators 8 are usually infrared radiators but, depending on the optical elements 3 to be coated, other wavelengths of radiation are also conceivable which in each case lead to the heating of the optical element 3.

At the same time of course, the radiators 3, via their radiation, also heat up the structure comprising the devices 2 for mounting the optical elements 3, the holding mechanism 4, the shafts 5, the crossbeam 6 and the axle 7. Because of the thermal and mechanical loadings on these elements, these are normally designed from a high-strength material, for example steel, and heat up to a much greater extent than the actual optical element 3 to be heated.

In the case of the previous plants, a large temperature difference therefore occurs between the devices 2 for mounting the optical element 3 and the optical element 3 itself. In the region in which the optical element 3 is supported on the devices 2, thermal conduction produces high point heating of the optical element 3, and said heating can propagate only inadequately in the latter, because of its generally comparatively poor thermal conductivity. The result is very high stresses because of the temperature gradient which additionally lie in the range in which, because the optical element 3 is supported on the devices 2 for mounting it, they already effect very high inputs of stress as a result of the gravitational force on the optical element 3.

If, then, high-value optical elements 3 made of crystalline materials, preferably of fluorides, for example calcium fluoride, are coated, the coating of other single crystals, for example made of germanium or the like, is also conceivable here, however, so that because of the superimposition of thermally induced stresses and stresses caused by gravitation, it is possible for a very high shear stress to occur in the critical area of the support of the optical element 3. As a result of this high shear stress, individual lattice planes of the crystalline optical element 3 can be displaced with respect to one another, as a result of which the optical element 3 becomes unusable for its planned intended use, since it is then plastically deformed.

Figure 2:
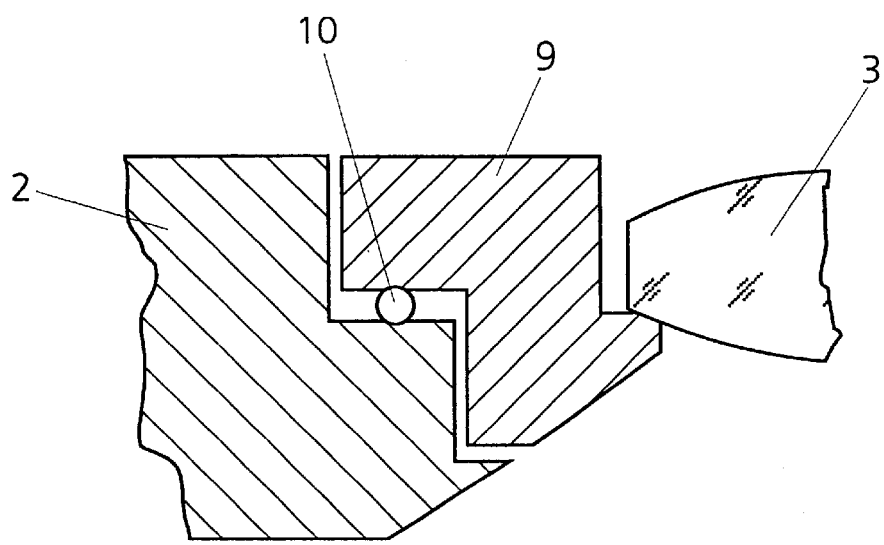
FIG. 2 shows a cross section through part of a device for mounting the optical element to be coated, according to the line II-II in FIG. 1.

In the case of the device illustrated here, this is avoided by the intermediate element 9 which can be seen in FIG. 2, and also by corresponding supporting elements 10. For this purpose, the intermediate element 9 is formed from a material which absorbs the radiation used for heating from the radiators 8, for example infrared radiators, to a lesser extent than the optical element 3 itself. This material can be, for example, an appropriate material made reflective. An intermediate element 9 made of aluminum and provided with a reflective gold coating has proven to be particularly beneficial. The aluminum, made reflective with the gold, reflects the greatest part of the incident infrared radiation from the radiators 8 and therefore, as opposed to the surrounding devices 2, is heated to a far lesser extent. The input of thermal energy into the edge region of the optical element 3 which is in any case highly loaded by the gravitational stresses, by the intermediate element 9 and by the devices 2 for mounting the optical element 3, can therefore be avoided.

In order, then, to decouple the intermediate element 9 thermally from the device 2 for mounting the optical element 3, the intermediate element 9 is supported on the device 2 via the supporting elements 10. In this case, the supporting elements 10 are designed from a material which conducts the heat to a far poorer extent than the device 2, normally designed from metal, and/or the intermediate element 9.

In addition, the supporting elements 10 are designed in a geometric form which forms only a very low contact area between the supporting element 10 itself and the device 2, on the one hand, and the intermediate element 9 on the other hand. Here, for example, thought can be given to conical, cylindrical or spherical elements. If the supporting elements 10 are at the same time additionally formed from a material with a correspondingly poor heat conduction, for example from a ceramic, then the input of heat into the optical element 3 by heat conduction from the device 2 for mounting the optical element 3 via the supporting elements 10 and the intermediate element 9 can virtually be ruled out. However, in particular because of their ideal mechanical properties, spheres made of ruby have been shown to be particularly suitable as supporting elements 10. Although these have a better thermal conductivity than ceramics, because of the very small contact area of the spheres, the thermal decoupling also functions very well here. The abovementioned problems relating to exceeding the critical shear stress because of the addition of thermal stresses and gravitational stresses in the area in which the optical element 3 is supported can therefore be avoided.

If the intermediate element 9, as described above, is an aluminum ring provided with a reflective gold coating, then this is additionally softer than the material normally used for the optical element 3, for example calcium fluoride, so that the material of the optical element 3 does not suffer any damage due to scratches or the like which, in the case of crystalline materials of this type could very easily lead to a lattice offset, cleavage or the like.

Of course, the intermediate element 9 is likewise vapor-coated with the layer applied to the optical element 3 by the vacuum coating plant 1 and, in the case of an antireflection coating, following repeated use leads to it no longer being possible completely to ensure the reflection of the radiation of the radiators 8 used for heating. The intermediate elements 9 then have to be cleaned or replaced.

On account of these considerations, the thermally resistant plastic already mentioned hereabove would be a very beneficial material for the intermediate ring 9, since this would be relatively soft and, on account of the comparatively small expenditure during its production, could be designed as a disposable article.

What is claimed is:

1. A holding device for an optical element, while the optical element is being coated in a vacuum coating plant having a mounting-device for the optical element, it being possible for the optical element to be heated in the vacuum coating plant via suitable radiation, wherein an intermediate element which has a lower thermal absorption than the mounting-device for the optical element is arranged between the mounting-device for the optical element and the optical element.

2. The device as claimed in claim 1, wherein the intermediate element is connected to the mounting-device for the optical element via supporting elements made of a poorly heat-conducting material.

3. The device as claimed in claim 2, wherein the supporting elements are designed as geometric bodies having a low contact area, at least in relation to the mounting-device for the optical element.

4. The device as claimed in claim 2, wherein the supporting elements are designed as cylindrical elements.

5. The device as claimed in claim 2, wherein the supporting elements are designed as spherical elements.

6. The device as claimed in claim 2, wherein the supporting elements are designed as conical elements.

7. The device as claimed in claim 2, wherein the supporting elements are formed from a material with a low thermal conductivity.

8. The device as claimed in claim 2, wherein the supporting elements are formed from ruby.

9. The device as claimed in claim 2, wherein the supporting elements are formed from ceramic.

10. The device as claimed in claim 1, wherein the intermediate element is formed of a material which absorbs the suitable radiation to a lesser extent than the mounting-device for the optical element.

11. The device as claimed in claim 1, wherein the intermediate element has a coating that reflects the suitable radiation.

12. The device as claimed in claim 1, wherein the intermediate element is formed from a material which is softer than the material of the optical element.

13. The device as claimed in claim 11, wherein the reflective coating has gold.

14. The device as claimed in claim 1, wherein the intermediate element is formed from an alloy containing aluminum.

15. The device as claimed in claim 1, wherein the optical element is made of a crystalline material.

16. The device as claimed in claim 1, wherein the optical element is made of $CaF_2$.

17. The device as claimed in claim 1, wherein the optical element is being coated by a vapor-deposition of at least one functional layer.

18. The device as claimed in claim 1, wherein the mounting-device comprises high-strength material.

19. The device as claimed in claim 1, wherein the mounting-device comprises steel.

* * * * *